United States Patent [19]

Elabd

[11] Patent Number: 4,939,369
[45] Date of Patent: Jul. 3, 1990

[54] IMAGING AND TRACKING SENSOR DESIGNED WITH A SANDWICH STRUCTURE

[75] Inventor: Hammam Elabd, Sunnyvale, Calif.

[73] Assignee: Loral Fairchild Corporation, Syosset, N.Y.

[21] Appl. No.: 253,271

[22] Filed: Oct. 4, 1988

[51] Int. Cl.⁵ .................... H01L 27/14; H01L 31/04
[52] U.S. Cl. ................................ 250/332; 250/330; 250/338.4
[58] Field of Search ............... 250/332, 330, 338.1, 250/338.4, 339, 370.01, 370.08, 370.14; 357/30 C

[56] References Cited

U.S. PATENT DOCUMENTS

| | | |
|---|---|---|
| 3,845,296 | 10/1974 | Schnitzler . |
| 3,902,066 | 8/1975 | Roosild et al. . |
| 3,962,578 | 6/1976 | Roschen . |
| 3,972,939 | 7/1976 | Andressen . |
| 4,054,797 | 10/1977 | Milton et al. ............... 250/370.08 |
| 4,214,264 | 7/1980 | Hayward et al. . |
| 4,238,760 | 12/1980 | Carr . |
| 4,316,206 | 2/1982 | Bottka et al. . |
| 4,423,325 | 12/1983 | Foss . |
| 4,443,701 | 4/1984 | Bailey . |
| 4,544,939 | 10/1985 | Kosonocky et al. . |
| 4,581,625 | 4/1986 | Gay et al. . |
| 4,604,652 | 8/1986 | Elabd et al. . |
| 4,651,001 | 3/1987 | Harada et al. . |
| 4,659,226 | 4/1987 | Elabd . |
| 4,679,068 | 7/1987 | Lillquist et al. . |
| 4,688,066 | 8/1987 | Elabd . |
| 4,751,571 | 6/1988 | Lillquist . |
| 4,767,209 | 8/1988 | Johnson .......................... 250/332 |

OTHER PUBLICATIONS

"CAM6000 IR Analog Head", Fairchild Weston Schlumberger advertising sales brochure, (undated).
"CAM6002 IR Analog Head", Fairchild Weston Schlumberger advertising sales brochure, (undated).
Dyck et al., "A 244×190 Element PtSi Imager build with Mature CCD Production Technology", (undated).
Terui et al., "Advances in CCD and Imaging", IEEE Int. Solid State Circuits Conference, 1980.
Kosonocky et al., "Schottky-barrier infrared image sensors", RCH Engineer, (May/Jun. 1982), 27–36.

Primary Examiner—Janice A. Howell
Assistant Examiner—Richard Hanig
Attorney, Agent, or Firm—Townsend and Townsend

[57] ABSTRACT

A multi-function imaging and tracking device is disclosed. A first Schottky diode array lying in a first plane performs a tracking and acquisition function. A second Schottky diode array lying in a second plane performs an imaging function. The first array is a low resolution, high-speed array while the second array is a high resolution, low-speed array.

42 Claims, 4 Drawing Sheets

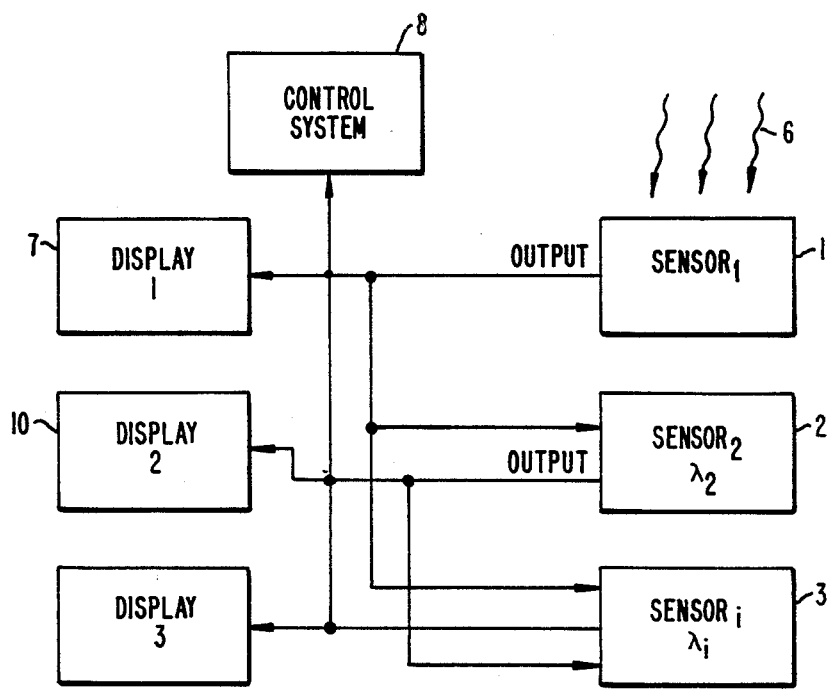
FIG._1.
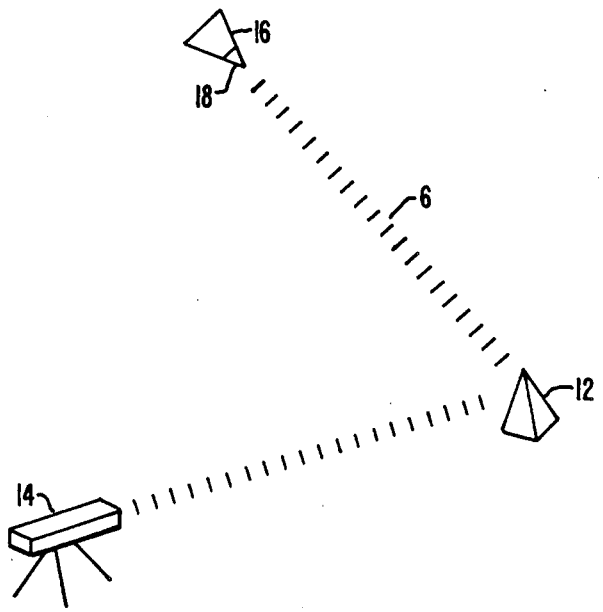
FIG._2.

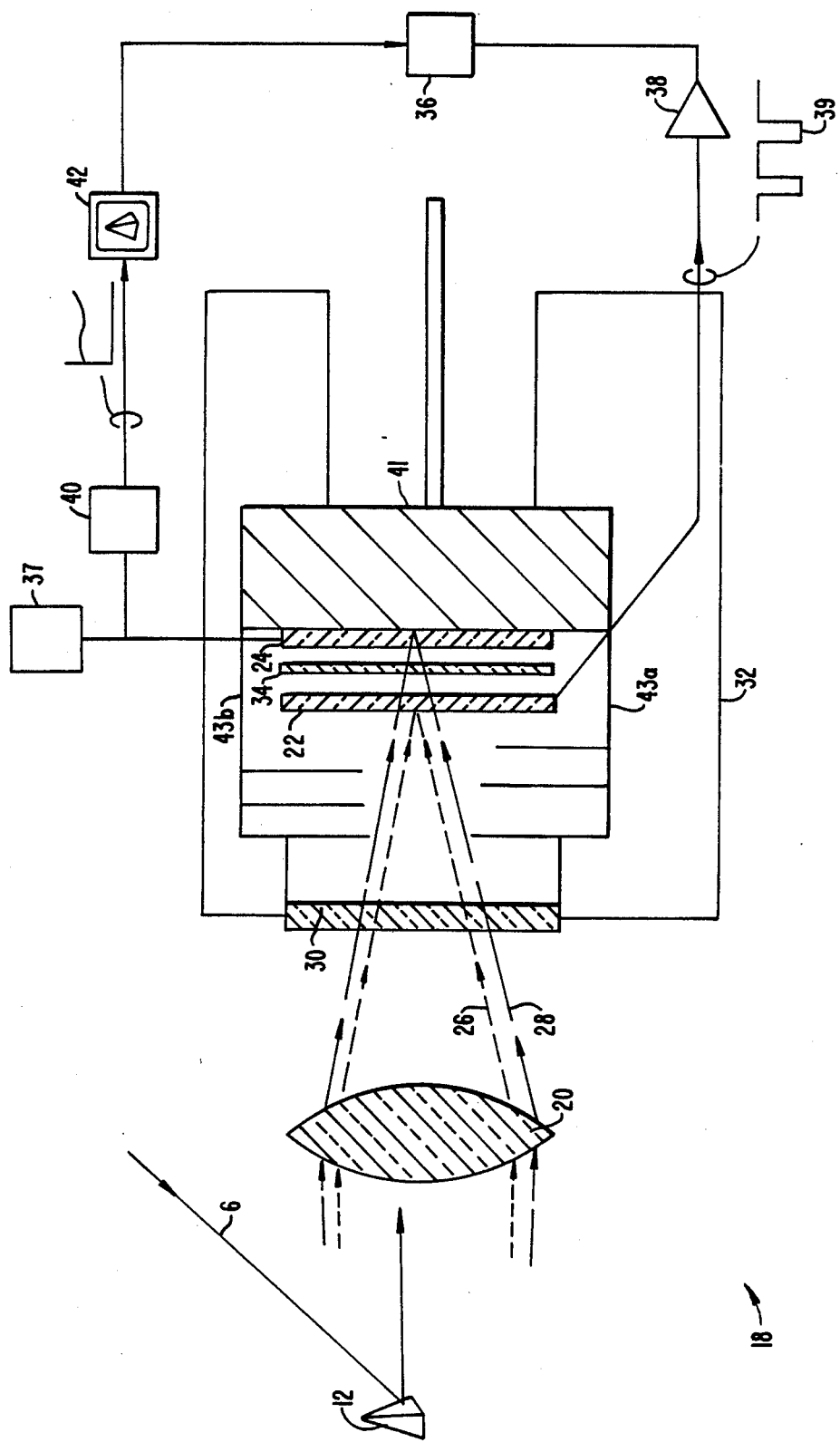
FIG._3.

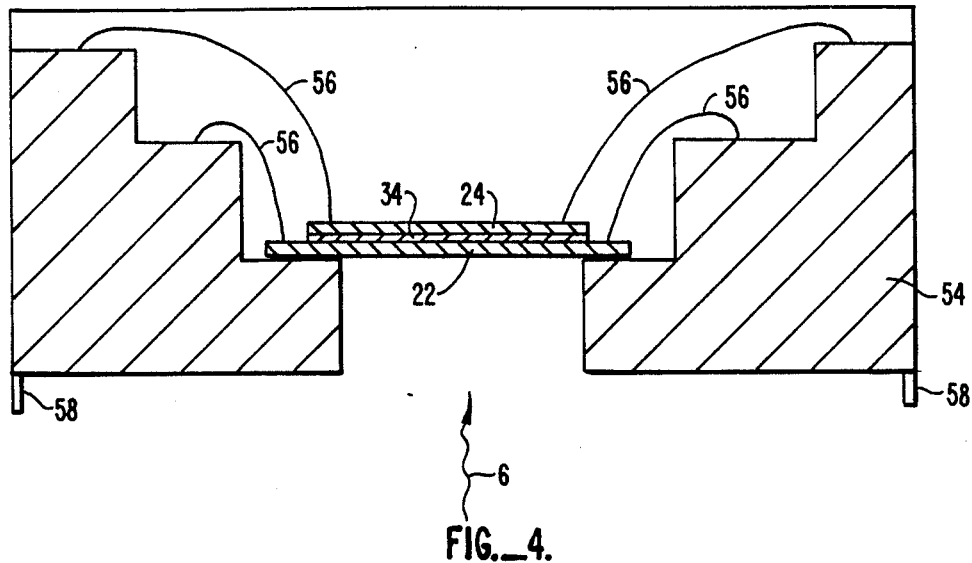
FIG._4.
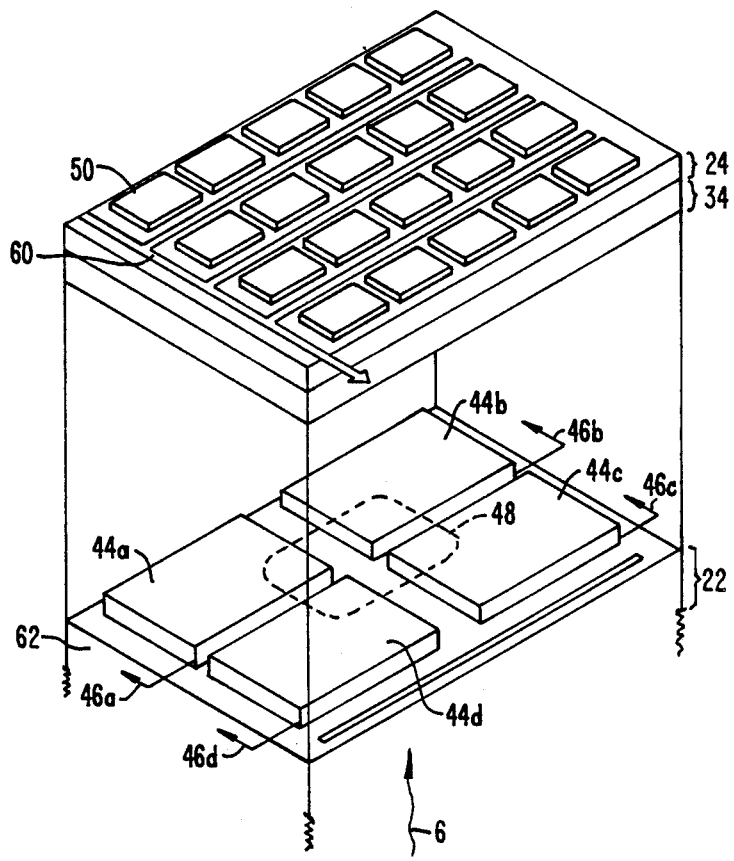
FIG._5.

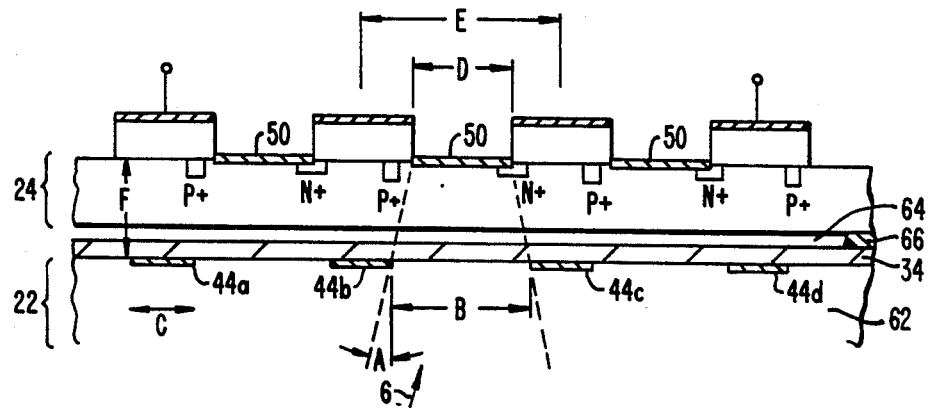
FIG._6.
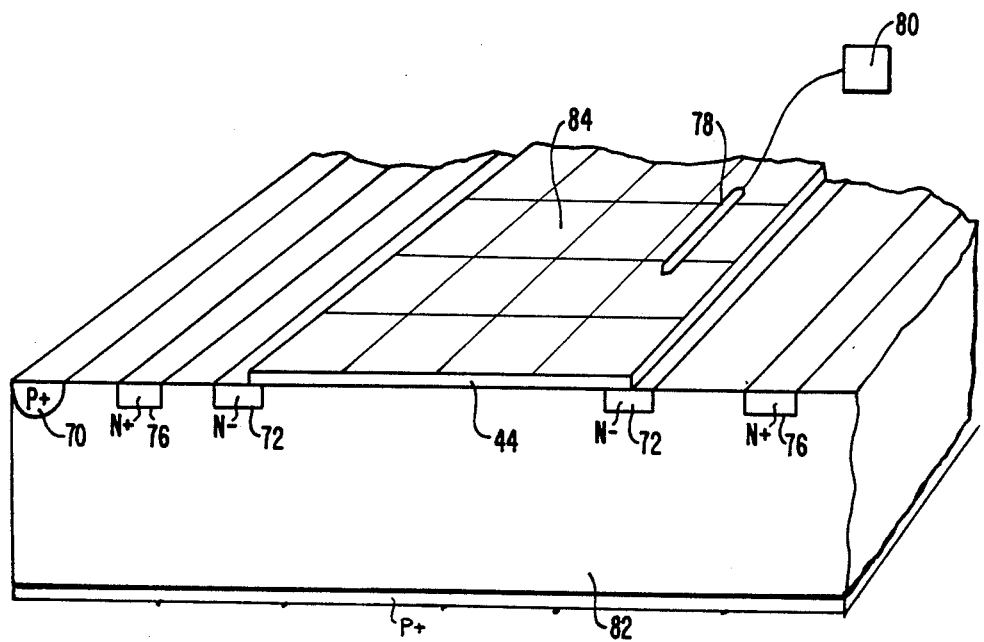
FIG._7.

IMAGING AND TRACKING SENSOR DESIGNED WITH A SANDWICH STRUCTURE

BACKGROUND OF THE INVENTION

1. Field of the Invention

The present invention relates to the field of semiconductor devices. More particularly, the present invention provides an improved device which can perform multiple functions such as imaging and tracking or multicolor imaging, especially with a first sensor operating in real time and a second sensor with functions controlled by the first sensor.

2. Description of Related Art

Charge coupled devices (hereinafter referred to as CCD's) and other charge transfer devices have been in wide use and have found particular utility in analog signal processing and as charge coupled imagers. In a simple charge coupled device, mobile charge packets (such as electrons or holes) are introduced at a first location in a silicon device. The silicon device may, for example, be a P- substrate. The charge packets can be introduced with an electrical charge injection or from electron-hole pair generation resulting from photon bombardment in a photosensing section. When the charge is generated from photon bombardment, an integration time may be provided so that a useful amount of charge is developed.

After generation, the charge is transferred out of the CCD using a series of gates along the surface of the silicon substrate. The gates are clocked to a series of voltage levels that move the charge along the semiconductor surface.

It has been proposed that such CCD's could be utilized to detect and image light of a variety of wavelength regions by forming photosensing cells adjacent to each other which alternately detect light of a first and a second wavelength. However, by forming the CCD in this fashion, the pixel density of each type of sensor is reduced and, therefore, the quality of the image that can be produced. Further, such structures would be unreliable for tracking since an IR laser spot, for example, could be focused on a visible sensing element on which it would not be detected.

Harada et al. (U.S. Pat. No. 4,651,001) disclose a CCD using two photosensing sections which are stacked. The first, upper photosensing section is an amorphous silicon layer utilized to detect visible light. Infrared light passes through the upper layer and is detected in a second, lower, Schottky diode layer. The structure is formed in this fashion to increase the pixel density and, therefore, image quality. Harada et al. use the same size pixel for both the visible and IR imaging and, further, use the same CCD multiplexer and output amplifier to read out two vastly different images (i.e., the visible and the IR).

The structure proposed by Harada et al. creates a wide variety of problems. For example, since Harada et al. utilize a combination of a Schottky diode and an amorphous silicon layer, it is necessary to provide a dramatic temperature gradient between the two layers. Specifically, the amorphous silicon layer must be maintained at near ambient conditions to prevent trapping of charges at low temperatures. Conversely, the Schottky diode portion must be maintained at or near liquid nitrogen temperatures in order to control the flow of dark current.

Consequently, a structure such as that proposed in FIG. 8 of Harada et al. must be provided. In such structure, the Schottky diode portion is mounted on a first side of a substrate and exposed to liquid nitrogen. The amorphous silicon layer is swept with dry nitrogen gas in order to maintain a large thermal gradient in the structure. It would be extremely difficult or impossible to implement a structure which could withstand such extreme temperature gradients reliably. Further, no band pass filter is used between the visible and IR portion. IR absorption occurs in the amorphous silicon layer and degrades the quality of the IR image and, in some wavelengths, opaque the IR. The structure provided by Harada et al. may, therefore, only be useful in a narrow band of interest. Also, near IR radiation is transmitted to the Schottky barrier divide, potentially causing the IR image to bloom. Still further, by using the same multiplexer and output amplifier for both the silicon amorphous layer and the Schottky diode portion, implementation would be impractical since the dynamic range and the charge handling capacity of both signals differ widely and simultaneous use of the two layers would not be possible. Still further, the structure provided by Harada et al. would be difficult to manufacture because it could require approximately 15 to 20 masking layers.

Roshen, U.S. Pat. No. 3,962,578, discloses a single element, two detector structure. The first detector is transparent to the wavelength of the inner detector. Both detectors are maintained at low temperature, the upper element sensing long wavelength, 1.4 $\mu$m light and the lower element detecting shorter wavelength 4.4 $\mu$m light. The first element may, for example, be an indium antimonide P-N junction chip, while the lower element is a germanium or silicon planar P-N junction chip. Both elements are read out by the same circuit and the same pixel size is used for the visible and the IR.

Roshen does not show or suggest a focal plane array, i.e., an array of sensors that could perform imaging in an x-y direction in one or more different frequencies over a wide field of view. No provision for sampling a single wavelength range of interest in the upper chip, while imaging the wavelength range of interest in the lower chip is shown or suggested.

Other patents discussing multi-function CCD's include Lilliquist (U.S. Pat. Nos. 4,751,571 and 4,679,068), in which an incoming beam of light is split, Schnitzler (U.S. Pat. No. 4,679,068) and Roosild et al. (U.S. Pat. No. 3,902,066).

Neither Harada et al. nor the remaining prior art show or suggest a method of effectively preventing sunlight from flooding a thermal imager. Further, the prior art does not show or suggest a method of simultaneously imaging within two spectral bands, especially with sensors operating at different frequencies or frame rates. Further, the prior art does not show or suggest two Schottky barrier focal plane arrays for simultaneous imaging in two different wavelengths using staggered or semi-transparent Schottky barrier detectors, especially using two independent CCD multiplexers and amplifiers. No provision for the operation of the two planes at different speeds or readout rates is shown or suggested.

From the above it is seen that an improved multi-mode sensor is needed. In particular it is desirable to provide a sensor in which a first layer can be used for detection, communication, and tracking while a second is used for simultaneous imaging. Further, it is desirable to provide a multi-mode sensor with improved element geometry to provide a combined imaging and laser tracking function.

SUMMARY OF THE INVENTION

A multi-function charge-coupled device is disclosed. In general the CCD includes a first and a second silicon detection array (otherwise referred to herein as focal plane arrays or FPA's). The first array samples a portion of the wavelength of interest, passing the remaining light entering the device to the second element for imaging. The first layer in one embodiment is used for acquisition and tracking and the lower element is used for imaging. In another embodiment the upper layer is used for visible imaging while the lower element is used for IR imaging.

More specifically, the first element comprises a Schottky diode quad cell that operates at a high frame rate or real time with low resolution for detection and tracking. The second element comprises a second array of Schottky diodes that operate a low frame rate with high resolution and is especially suited for imaging.

BRIEF DESCRIPTION OF THE FIGURES

FIG. 1 is a chart illustrating the operation of the invention described herein.

FIG. 2 shows the acquisition and tracking system.

FIG. 3 shows the tracking and imaging sensor illustrated in FIG. 2 in greater detail.

FIG. 4 illustrates the packaging system for the tracking and imaging FPA's in cross-section.

FIG. 5 shows a detailed isometric view of one preferred embodiment of the tracking and imaging FPA's.

FIG. 6 is a detailed cross-section of a second embodiment of the tracking and imaging arrays.

FIG. 7 is a more detailed cross-section of one of the quad cells of the tracking array.

DETAILED DESCRIPTION OF THE PREFERRED EMBODIMENTS

FIG. 1 illustrates the general operation of the device disclosed herein. The system comprises a first sensor 1 which may perform a tracking function, an imaging function, or the like. In a preferred embodiment the first sensor is a laser sensor quad cell which performs a tracking function based on input of a laser light component of light 6. The apparatus also includes a second sensor 2 which may be a focal plane array (FPA) and which performs an imaging function at a first wavelength of interest, which may be the infrared (IR) region. The device optionally includes additional sensors (illustrated by 3) which may be additional focal plane arrays performing imaging at wavelengths $\lambda_i$.

The output from sensor 1 may be processed and used in a display 7. The output may also be used in a feedback loop to second sensor 2. For example, the first sensor may be used to provide a switching function to sensor 2 and/or sensor 3 such that, for example, the second sensor is activated only when the first sensor detects a coded laser. Alternatively, the feedback to sensor 2 could be used to adjust the gain, frame rate, black level, dynamic range, start integration time, integration time, exposure control or field of view in sensor 2. The output from sensor 1 may further be used in control system 8. Control system 8 may be, for example, a tracking system which maintains the sensors in a position oriented towards the target. Control system 8 may also include an image processing system which convolutes, i.e., performs sensor fusion from images produced at a variety of wavelengths.

Sensor 2 provides imaging at a first wavelength of interest at a second display 10. In addition, sensor 2 may also provide feedback to additional sensor 3. Sensors 2 and 3 may also provide feedback to control system 8.

FIG. 2 illustrates the invention described herein as it is used to track and image a target 12. A beam, preferably a laser beam, is projected from a laser 14 or other similar source of coherent light, to the target 12 for identification. In one embodiment, laser 14 is a 1.06 micron YAG laser of the type commonly known to those of skill in the art. In an alternative embodiment the quad cell may be used to track several lasers simultaneously, e.g., 1.06 and 3.4 $\mu$m lasers. Other similar devices such as diodes (LED's) and a phase array of lasers or diodes could also be used. The laser beam is reflected from the target, as illustrated with lines 6, to a tracking and imaging structure 16.

Structure 16 may be, for example, an aircraft, satellite or missile, and the target may be a navigation location. Alternatively, the target could be an industrial goods on an assembly line and the tracking and imaging structure could be performing a quality control function. A wide variety of additional military and industrial targets and tracking and imaging structures will be apparent from this disclosure.

The light from laser 14 may optionally be coded, i.e., it may be switched rapidly from an on to an off state or otherwise modulated in a unique pattern so as to be readily identified. The laser could be coded, for example, at 10 MHz.

Tracking and imaging structure 16 includes an imaging and tracking sensor 18. Imaging and tracking sensor 18 is illustrated in more detail in FIG. 3. Light, again indicated by arrow 6, is reflected from target 12 through a lens 20. Lens 20 is preferably a wide band pass lens and could be a ZnSe lens. Alternatively, a Newtonian telescope with reflective mirrors could be used to direct light at the arrays. Lens 20 is located such that the image from target 12 is focused on tracking array 22 and imaging FPA array 24. More specifically, the lens is located such that short wavelength radiation of interest (indicated by lines 26) is focused on the tracking array 22 while long wavelength radiation of interest (indicated by lines 28) is focused on imaging array 24. Optical window 30 serves to permit light into dewar section 32. In one embodiment, the window is coated to serve as a filter and, in particular, as a 3-5 $\mu$m and 1.06 $\mu$m filter.

Vacuum dewar 32 is of the type readily known to those of skill in the art. The dewar serves to maintain components of the tracking and imaging sensor at approximately 77° K. In particular it is important to maintain a tracking FPA 22 and the imaging FPA 24 in this temperature range.

Band pass filter 34 may be located between the tracking FPA 22 and the imaging FPA 24. In a preferred embodiment, the band pass filter 34 is a 3-5 $\mu$m filter. Filter 30, therefore, allows laser and 3-5 $\mu$m light to contact array 22 while filter 34 removes any laser component and allows only thermal IR to contact array 24. Filter 34 may also reflect laser light for a second pass onto quad cell 22.

In general the tracking FPA array 22 operates at high speed and with high frequency response and low angular resolution, especially for detection of a laser designated target. The imaging FPA array 24 may serve an additional acquisition and tracking function but also serves an imaging function in the same or another spectral band as the tracking FPA and operates at low speed/frequency with higher angular resolution. Imaging FPA array 24 will also be provided with FPA drive electronics 37 of the type readily known to those of skill in the art. In a preferred embodiment, the tracking array 22 is used to detect 1.06 μm laser light while the imaging FPA array 24 is used for thermal IR imaging in the 3–5 μm range.

The tracking array operates at high speed, preferably in real time. The tracking array is a low resolution quad cell, 2×2 element. The imaging array is a high resolution, 488×512 element. If multiple arrays were to be provided, it may be desirable to provide arrays in a "pyramid" fashion, e.g., to have the first array be a 100×100 array, the second array a 200×200 array, the third a 400×400 array, etc. This would reduce the real time processing requirements by using a low element array to detect a target and a higher resolution array to examine a specific area of interest. The preferable range of characteristics of the imaging array and tracking array are listed in Table 1.

TABLE 1

| | Array Characteristics | |
| --- | --- | --- |
| Characteristic | Tracking Array | Imaging Array |
| Frame Rate | high frame rate; 30 to 10,000 f/s | low frame rate; 1 to 1000 f/s |
| Real Time Pulse Width | short pulse; 1 nsec to 100 μsec | pixel times corresponding to the above frame rate |
| Resolution | low resolution; full field of view to less than the resolution of the imaging array | high resolution; 256 × 244 element array to 5000 × 5000 element array |

In a preferred embodiment the acquisition and tracking array will be used to detect a coded laser beam which has been directed at the target 2. Specifically, the laser beam is detected by tracking array 22 and the output of the tracking array is delivered to a tracker 36 of the type commonly known to those of skill in the art of a control system such that it may issue tracking commands. In one embodiment, upon target detection, the tracking array 22 is deactivated and the imaging array 24 is activated. The imaging array is then used to continue to track and image the target. The laser may similarly be deactivated after sending a laser code or when the tracking array is deactivated. This serves to reduce the risk of detection of the laser in a military system. Since the imaging array would tend to use excessive amounts of power, the switching function of the tracking array could prove especially important in environments in which the availability of power is limited such as in satellites.

The tracking array 22 is preferably a platinum or paladium silicide (PtSi/Pd$_2$Si) quad cell on Si Schottky barrier detectors. The imaging array 24 may comprise a platinum or paladium silicide CCD of the type well known to those of skill in the art and may be, for example, an infrared (IR) CCD.

In another embodiment, the tracking array is a quad cell of germanium or InAs operating at much lower frequencies, i.e., at about 1 MHz to 1 Khz. The tracking array would preferably cover most or all of the field of view of the imaging array.

Signals are transferred from the tracking array by means well known to those of skill in the art and are processed in a low noise (i.e., less than about 100 pico ampere per root hertz) pre-amplifier 38. Amplifier 38 is mounted in the head of a camera along with the arrays 24 and 22 in order to produce a better signal-to-noise ratio. Signals from tracking array 22 (illustrated by plot 39) are then fed to the tracker 36 or other control system that generates the x and y direction of commands. Signals from the imaging array are processed in a multiplexer 40 using means well known to those of skill in the art and are eventually utilized in, for example, a video display 42 and may further assume the previous role of the tracking array by sending signals to tracker 36. The multiplexers used herein could comprise a group of CCD and MOS registers used to read out the charge from the Schottky barrier detectors to the output amplifiers, and could be readily constructed by one of skill in the art.

Joule Thompson cryostat 41 serves to maintain the arrays at approximately liquid nitrogen temperatures (77° K.). Cold shields 43a and 43b serve to define the field of view of the device.

Details regarding the construction of the packaging for tracking array 22 and the imaging array 24 are provided in FIG. 4. As shown, the band pass filter 34 is sandwiched between separately fabricated arrays 22 and 24 and the entire assembly is mounted in packaging device 54 which may be filled with epoxy or the like. Filter 34 may be deposited on top of array 22 or behind array 24. Wires 56 are connected to pins 58 so as to provide external communication to and from the device.

Greater detail regarding the construction of the tracking and imaging arrays 22 and 24 in the preferred embodiment is provided in FIG. 5. As shown, the tracking array 22 comprises a quad cell which includes four Schottky diodes, 44a, 44b, 44c, and 44d, each having a voltage output 46a, 46b, 46c, and 46d. Also illustrated is a laser spot 48 which has been projected on the tracking array by optics (not shown). As shown, the tracking array is ideally suited for determining the centroid of a target because the relative magnitude of the voltages 46a–d can precisely determine the location of the laser spot 48. This information could further be used to reposition the device so as to be precisely centered on the laser identified target.

The vast majority of light entering the quad cell passes directly through the quad cell and into the band pass filter 34. Band pass filter 34 passes only 3–5 μm light to the imaging array 24.

As shown in FIG. 5, the imaging array includes an array of Schottky diodes 50. It is to be understood that 20 diodes are shown for purposes of illustration, but in fact a very high pixel density array is provided in layer 24 (e.g., a 488×512 element array). As can be seen from FIG. 5, the quad cell largely covers the field of view of the imaging array 50, and in an alternative embodiment, the array 44 could consist of a single Schottky barrier which would completely cover the field of view of the imaging array. Transfer register 60 is used to provide output for an infrared image.

In general, the optical loss of 1.064 μm light under these conditions is expected to be 25% at 300° K. with a 10 angstrom thick PtSi layer and a silicon layer 62 of 15 mil (based on computer simulations). At 80° K. (i.e., the expected liquid nitrogen temperature at which the device is operated) the loss would be less. Joule Thompson cryostats, sterling cycle refrigerators, liquid nitrogen dewars, or passive coolers could be used for this purpose.

Greater detail regarding one embodiment of the tracking array 22 and the imaging array 24 is provided in FIG. 6. An alternative geometry of the device is also illustrated in which the diodes of array 22 lie outside of a raypath of the diodes 24.

The arrays 24 and 22 are illustrated as though they are fabricated independently and, thereafter, aligned and connected. It should be recognized that the device could also be fabricated monolithically by printing the PtSi/Pd$_2$Si cells 22 on the back of the PtSi/Pd$_2$Si array 24. It is believed, however, that the embodiment illustrated in FIG. 6 could be more easily fabricated.

Light enters the device as illustrated by arrow 6. A 1.06 μm laser is detected in the PtSi/Pdphd 2Si Schottky barriers 44a, b, c, and d on a silicon substrate 62. Although PtSi/Pd$_2$Si barriers are preferred, any metal silicide on silicon-type barriers could readily by substituted. The layer of metal silicide comprising each barrier is preferably 5–100 angstroms thick. The sensitivity (i.e., quantum efficiency) of the detector 22 is determined by the requirements of a specific application, but may be, for example, 10–30%. The substrate is preferably P type. PtSi/Pd$_2$Si diodes 44 convert electromagnetic radiation into photocurrent that is amplified in the preamplifier.

As shown in FIG. 6, the diodes 44 may be offset from the diodes 50 so as to lie out of the raypath and cold shield cone angle of incoming light. In a preferred embodiment the diodes 44 are arranged such that the edges of a diode 44 and its underlying diodes 50 are offset. In fact, the angle indicated by "A" in FIG. 6 is preferably 9.5°.

The 3–5 μm filter 34 is located between array 22 and array 24. In the preferred embodiment filter 34 is several dielectric layers of controlled thickness used to band pass 3–5 μm radiation. Filter 34 is constructed by depositing the dielectric on the back of the sensor 22 or the front of sensor 24 and may preferably be several layers of silicon dioxide or monoxide and silicon.

Adjacent the filter, an air gap 64 is formed between the filter 34 and the imaging array 24. The gap is formed by placing a plurality of epoxy spacers 66 between the filter and the imaging array. Epoxy spacers 66 are preferably silver epoxy. In the preferred embodiment, the air gap 64 is less than 0.5 mil thick. The air gap is necessitated by virtue of the separate fabrication of arrays 22 and 24, and may readily be substituted with, for example, an IR transparent layer of epoxy.

The imaging array 24 and associated electronics are of the type known to those skilled in the art and in the preferred embodiment include a Fairchild Weston CAM6002 using a CCD2443 244×256 element or similar high resolution FPA.

FIG. 7 provides still further greater detail regarding the construction of one element of quad cell 24. Schottky barrier 44 is placed on substrate 62. All of the Schottky barriers are surrounded by P+ ground plane 70, which serves as ground. N+ edge drain 76 serves to prevent stray charge from entering the device and N-ground ring 72 serves to prevent edge breakdown. Aluminum contacts 78 connect the barrier to pad 80, which transmits the charge out of the device. In a preferred embodiment, aluminum and N+ gratings 84 are provided on the PtSi cell 44, so as to reduce the series resistance therein. A shallow Pt layer may also be provided on the bottom of the substrate and may optionally also be provided with an aluminum mesh.

The quad cell could be constructed in a wide variety of process steps, but a preferred sequence of semiconductor processing steps is summarized below.
1. Begin with a P<100> 10 to 30,000 ohm-cm starting material.
2. Oxidize the surface of the starting material.
3. Deposit a nitride layer.
4. Define active area.
5. Blanket implant a P- well implant to adjust surface potential.
6. Follow with field oxidation.
7. Apply a P+ mask to define the ground potential and connect to top surface ground.
8. An N+ mask layer is defined to reduce series resistance in the diode and to define edge drains.
9. Follow by glass flow process.
10. Define Schottky barrier contacts where Pt or Pd silicide detectors are formed.
11. Cavity dielectric evaporation and definition is conducted.
12. Metallization and definition are provided.
13. Follow with backlap and polish (3–10 mils final) to reduce substrate thickness to where the depletion layer of the detector punches through to the backside.
14. Follow by P+ implant and aluminum metallization mesh to reduce series resistance in the substrate.

The preferred dimensions for the device illustrated in FIG. 6 are shown in Table 2. While the dimensions illustrate a device with the first and second array in close proximity, it would also be possible to use the invention with the arrays significantly displaced so as to produce a highly defocused laser image on the tracking array.

TABLE 2

| Dimensions of Array Structure | |
|---|---|
| 1. Distance between diodes 30 (see reference B) | 23 μm |
| 2. Width of diodes 30 (see reference C) | 8.5 μm |
| 3. Width of diodes 38 (see reference D) | 17 μm |
| 4. Center-to-center distance between electrodes 30 (see reference E) | 31.5 μm |
| 5. Distance from filter 22/array 20 interface to surface of array 14 (see reference F) | 20 μm |

After fabrication of the tracking array, the tracking array and imaging array are aligned in the desired configuration and bonded with epoxy or the like. One possible alignment method is described in U.S. Pat. No. 4,659,226 which is incorporated herein by reference for all purposes.

It is to be understood that the above description is intended to be illustrative and not restrictive. By way of example, while various implants in the semiconductor device have been described with respect to P and N type dopants, it is readily apparent to those of skill in the art that the role of these materials could be reversed. Other modifications will be immediately apparent to those of skill in the art. The scope of the invention should, therefore, be determined not with reference to the above description, but should instead be determined with reference to the appended claims, along with the full scope of equivalents to which such claims are entitled.

What is claimed is:
1. Apparatus for detecting and imaging a target comprising:

(a) means for detecting light reflected from the target, said means for detecting comprising a low angular resolution array;
(b) means for imaging a target detected by the means for detecting, said means for imaging comprising a higher angular resolution array; and
(c) means for control of said means for imaging connected to said means for detecting, said means for detecting light controlling said means for imaging the target.

2. Apparatus for imaging a target comprising:
(a) means for detecting light reflected from the target, said means for detecting operating at a rate selected from the group of a high frame rate and real time; and
(b) means for imaging the target, said means for imaging having one or more operational parameters adjusted in response to the output of said means for detecting.

3. Apparatus as recited in claims 1 or 2 further comprising means for transmitting light to the target, said light detected by said means for detecting.

4. Apparatus as recited in claims 1 or 2 further comprising means for transmitting light to the target, said light detected by said means for detecting, wherein said means for transmitting light is selected from the group of lasers, LEDs, and phase arrays thereof.

5. Apparatus as recited in claim 4, wherein said means for transmitting light transmits a beam selected from the group of coded and modulated beams.

6. Apparatus as recited in claims 1 or 2, wherein said means for detecting and said means for imaging are mounted on a structure selected from the group of an aircraft, a satellite, a missile, and an industrial platform.

7. Apparatus as recited in claims 1 or 2, further comprising a lens, said lens focusing light of a first wavelength of interest from the target on said imaging array and projecting light of a second wavelength of interest on said means for detecting.

8. Apparatus as recited in claim 7, wherein said means for detecting is mounted between said lens and said means for imaging, said means for detecting sensing light of a different wavelength than said means for imaging.

9. Apparatus as recited in claim 7 further comprising a 3-5 $\mu$m and 1.06 $\mu$m filter between said lens and said means for detecting.

10. Apparatus as recited in claims 1 or 2, wherein said means for detecting and said means for imaging are both in a low-temperature bath.

11. Apparatus as recited in claim 10, wherein said low-temperature bath is selected from the group of liquid nitrogen dewars, Joule Thompson cryostats, sterling cycle refrigerators and passive coolers.

12. Apparatus as recited in claim 2, wherein said operational parameter is selected from the group of frame rate, gain, black level, dynamic range, time of start integration, integration time, exposure control, field of view, and position of the means for imaging.

13. Apparatus as recited in claims 1 or 2, wherein said means for detecting is an array of Schottky barrier detectors selected from the group of platinum silicide and paladium silicide detectors.

14. Apparatus as recited in claim 13, wherein said means for imaging is an array of PtSi Schottky barrier detectors.

15. Apparatus as recited in claims 1 or 2, wherein said means for tracking operates with pulse widths from 1 nanosecond to 1000 nanoseconds.

16. Apparatus as recited in claim 15, wherein said imaging array operates in the range of 1 frame/second to 1000 frames/second.

17. Apparatus as recited in claims 1 or 2, wherein said tracking array operates at about real time and said imaging array operates at about 30 frames/second.

18. Apparatus as recited in claims 1 or 2, wherein said tracking array substantially covers part of the field of view of said imaging array.

19. Apparatus as recited in claims 1 or 2, wherein said means for tracking is in the range from full field of view to a 2×2 quad cell and said imaging array is about a 256×244 to 5000×5000 array.

20. Apparatus as recited in claims 1 or 2, wherein signals from said means for tracking are amplified in a low-noise amplifier.

21. Apparatus as recited in claims 1 or 2, wherein elements of the means for detecting are offset from elements of the means for imaging.

22. Apparatus as recited in claims 1 or 2, wherein said means for detecting and said means for imaging are mounted on a structure selected from the group of an aircraft, a satellite, and a missile, and the target is a navigation target.

23. A semiconductor device for detecting and imaging a target comprising:
(a) a first array of Schottky diodes, said first array being a high resolution array;
(b) a second Schottky diode array mounted in a plane displaced from said first Schottky diode array, said second Schottky diode array having a resolution different from said first array; and
(c) means for controlling said first array upon detection of target by said second array.

24. The semiconductor device as recited in claim 23, wherein the first array is a 2×2 quad cell and said second array is a 488×512 element array.

25. The semiconductor device as recited in claim 23, wherein elements of the second array are located between the first array and an object to be imaged.

26. The semiconductor device as recited in claim 25, further comprising a lens, said lens located between the object to be imaged and the second array, said lens projecting light having a wavelength of about 1.06 $\mu$m on said second array and light having a wavelength in the range of 3-5 $\mu$m on said second array.

27. The semiconductor device as recited in claim 24, wherein said second array is selected from the group metal barrier Schottky barrier diodes, PtSi, Pd$_2$Si, IrSi Schottky barrier arrays, and combinations thereof.

28. The semiconductor device as recited in claim 24, wherein said first array is an imaging array.

29. The semiconductor device as recited in claim 26 further comprising a 3-5 $\mu$m filter between said first and said second array, said filter 1.06 $\mu$m radiation to said first array whereby the filter reacting acts as a dielectric mirror.

30. The semiconductor device as recited in claim 24 further comprising a liquid nitrogen bath for maintaining said first and said second array at substantially 80° K. or below.

31. Apparatus as recited in claim 24 further comprising a control system, said control system adjusting an operational parameter of said first array based on input from said second array, said operational parameter selected from the group of gain, frame rate, black level, dynamic range, start integration time, exposure control, field of view, and position of the means for imaging.

32. Apparatus as recited in claim 23 further comprising metal gratings on elements of said second array.

33. Apparatus as recited in claim 32, wherein said gratings are aluminum and N+ gratings.

34. Apparatus as recited in claim 23, wherein a depletion layer of a detector in said first array protrudes through a substrate of the detector.

35. A semiconductor device for detecting and imaging a target comprising:
    (a) a first array of Schottky diodes, said first array being high resolution array; and
    (b) a second Schottky diode array mounted in a plane displaced from said first Schottky diode array, said second Schottky diode array having a resolution different from said first array, wherein the second array operates in the range from real time or at a frame rate in the range from 30 to 10,000 frames per second and said first array operates in the range from one frame per second to 2,000 frames per second.

36. Apparatus as recited in claim 35 further comprising a first multiplexer for processing signals from said first array and a second multiplexer for processing signals from said second array.

37. A semiconductor device for detecting and imaging a target comprising:
    (a) a first array of Schottky diodes, said first array being a high resolution array; and
    (b) a second Schottky diode array mounted in a plane displaced from said first Schottky diode array, said second Schottky diode array having a resolution different from said first array, wherein elements of the second array are located between the first array and an object to be imaged, and wherein elements of the second array lie outside of array path of light from the object to be imaged to the first array.

38. The semiconductor device as recited in claim 37, wherein said second array is a PtSi Schottky diode array.

39. A semiconductor device for detecting and imaging a target comprising:
    (a) a first array of Schottky diodes, said first array being a high resolution array; and
    (b) a second Schottky diode array mounted in a plane displaced from said first Schottky diode array, said second Schottky diode array having a resolution different from said first array, further comprising means for activating said first array upon detection of a target by said second array.

40. A kit for detecting and imaging a target comprising:
    (a) means for transmitting coded light to a target of interest;
    (b) a first Schottky diode array for detecting said coded, coherent light, said first Schottky diode array being a low resolution Schottky diode array selected from the group platinum, paladium, and iridium;
    (c) a second Schottky diode array adapted to be positioned such that said first array is between the target and the second array, said second Schottky diode array having a resolution different than said first array and comprising a Schottky diode array;
    (d) a lens for focusing said coherent light on said first array and thermal infrared light on said second array;
    (e) a first multiplexer and a low noise amplifier for processing signals from said first array;
    (f) a second multiplexer for processing signals from said second array; and
    (g) means response to a signal from said first array for affecting the operation of said second array.

41. Apparatus for imaging a target comprising:
    (a) means for detecting light reflected from the target, said means for detecting operating at a rate selected from the group of a high frame rate and real time; and
    (b) means for imaging the target, said means for imaging having an operational parameter adjusted by said means for detecting, wherein said means for imaging is activated upon detection of a target by said means for detecting.

42. Apparatus for detecting and imaging a target comprising:
    (a) means for detecting light reflected from the target, said means for detecting comprising a low angular resolution array; and
    (b) means for imaging a target detected by the means for detecting, said means for imaging comprising a higher angular resolution array, wherein said means for imaging is activated upon detection of a target by said means for detecting.

* * * * *